(12) United States Patent
Robbins et al.

(10) Patent No.: US 8,581,406 B1
(45) Date of Patent: Nov. 12, 2013

(54) FLIP CHIP MOUNTED MONOLITHIC MICROWAVE INTEGRATED CIRCUIT (MMIC) STRUCTURE

(75) Inventors: James A. Robbins, Groton, MA (US); William J. Davis, Hollis, NH (US); Robert B. Hallock, Newtown, NH (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/452,114

(22) Filed: Apr. 20, 2012

(51) Int. Cl.
*H01L 23/48* (2006.01)
*H01L 29/76* (2006.01)
*H01L 23/10* (2006.01)

(52) U.S. Cl.
USPC .............. 257/751; 257/288; 257/706

(58) Field of Classification Search
USPC .......................... 257/751, 288, 706
See application file for complete search history.

(56) References Cited

U.S. PATENT DOCUMENTS

| | | | |
|---|---|---|---|
| 5,524,339 A * | 6/1996 | Gorowitz et al. | 29/841 |
| 5,757,072 A * | 5/1998 | Gorowitz et al. | 257/700 |
| 5,977,631 A * | 11/1999 | Notani | 257/728 |
| 6,118,357 A * | 9/2000 | Tomasevic et al. | 333/247 |
| 6,124,636 A | 9/2000 | Kusamitsu | |
| 6,495,915 B1 * | 12/2002 | Hsieh et al. | 257/728 |
| 7,631,414 B2 | 12/2009 | Quil et al. | |
| 8,039,957 B2 | 10/2011 | Heinrich et al. | |
| 2003/0189246 A1 * | 10/2003 | Iwaki et al. | 257/706 |
| 2005/0104204 A1 | 5/2005 | Kawakubo et al. | |
| 2006/0211233 A1 | 9/2006 | Gan et al. | |
| 2008/0064142 A1 | 3/2008 | Gan et al. | |
| 2008/0308922 A1 | 12/2008 | Zhang et al. | |
| 2010/0013088 A1 | 1/2010 | Davis et al. | |
| 2013/0075795 A1 * | 3/2013 | Hauhe et al. | 257/288 |

OTHER PUBLICATIONS

U.S. Appl. No. 13/200,477, filed Sep. 23, 2011, entitled Aerogel Dielectric Layer, pp. 1-21.
U.S. Appl. No. 13/331,408, filed Dec. 20, 2011, entitled Method for Packaging Semiconductors at a Wafer Level, pp. 1-15.
G. Baumann, E. Willer, F. Buchali, D. Ferling, H. Ritcher, W. Heinrich, Evaluation of Glob Top and Underfill Encapsulated Active and Passive Structures for Millimeter Wave Application, pp. 26-31.

* cited by examiner

*Primary Examiner* — Long K Tran
*Assistant Examiner* — Dzung Tran
(74) *Attorney, Agent, or Firm* — Daly, Crowley, Mofford & Durkee, LLP

(57) ABSTRACT

A MMIC flip chip mounted to a circuit board having an underfill material disposed between the MMIC and the circuit board and a barrier structure for preventing the underfill material from being disposed under an electronic device of the MMIC while providing a cavity under the electronic device.

25 Claims, 11 Drawing Sheets

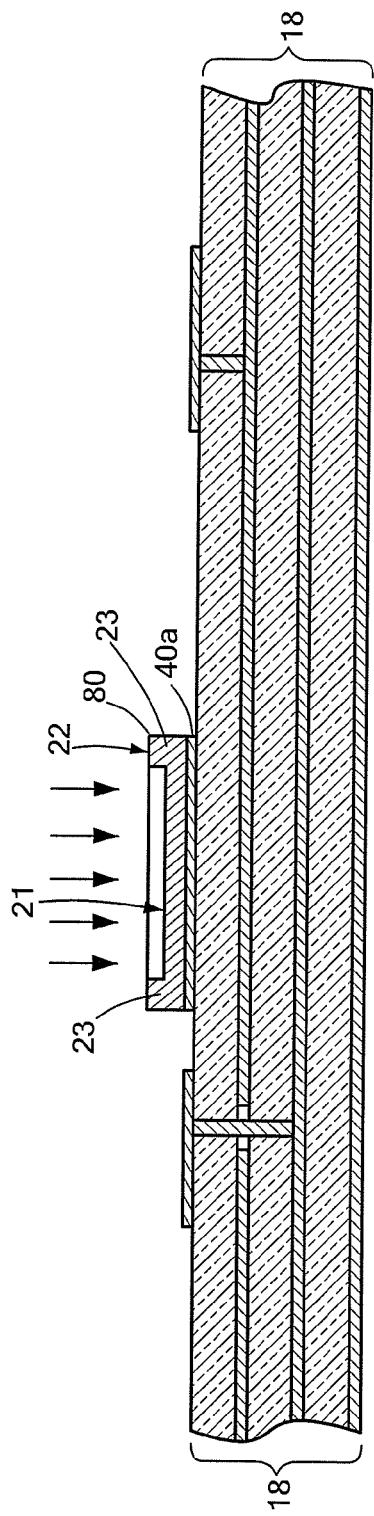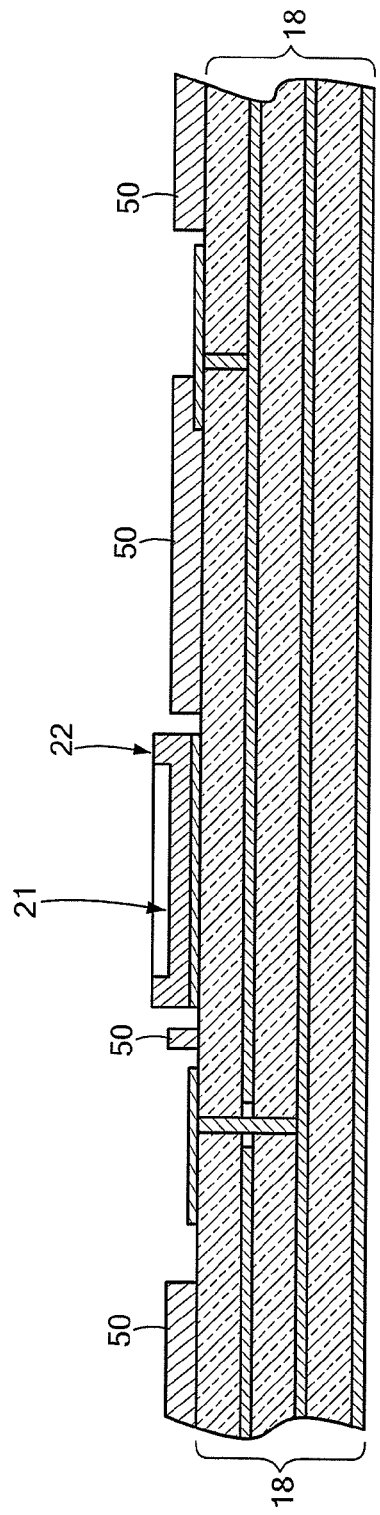
FIG. 3C
FIG. 3D

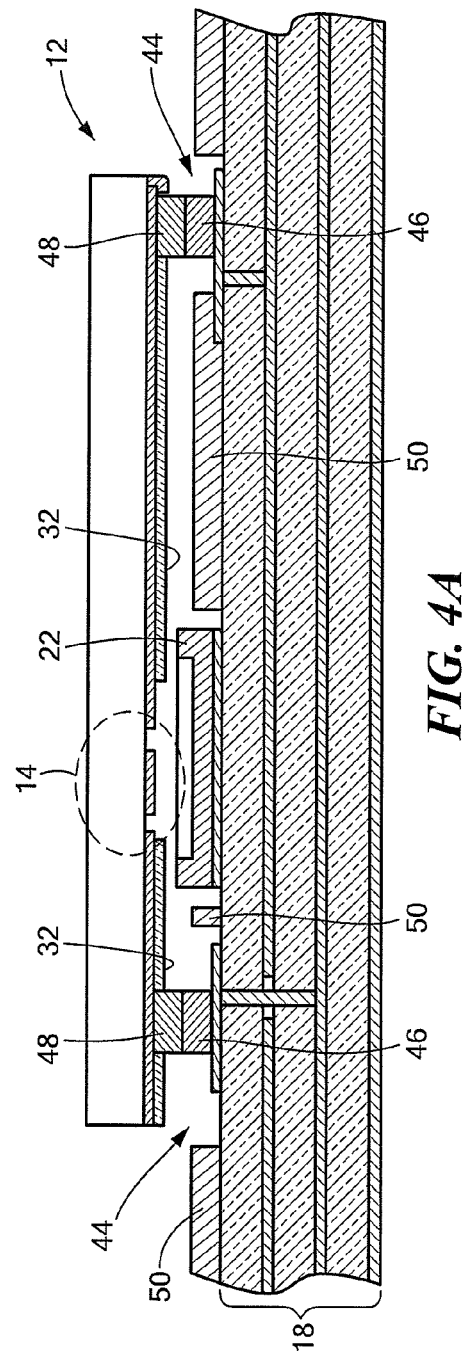
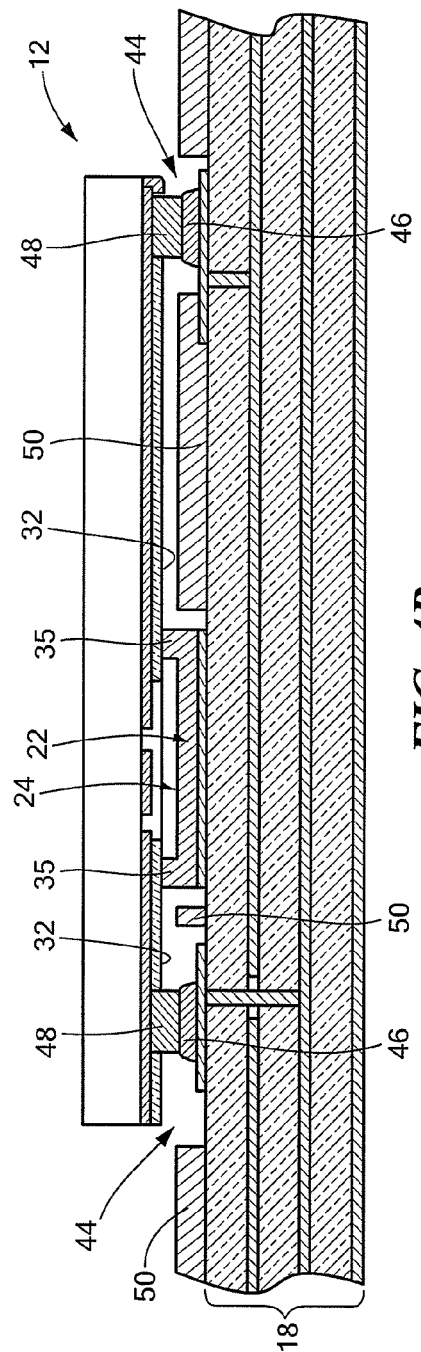
FIG. 4A
FIG. 4B

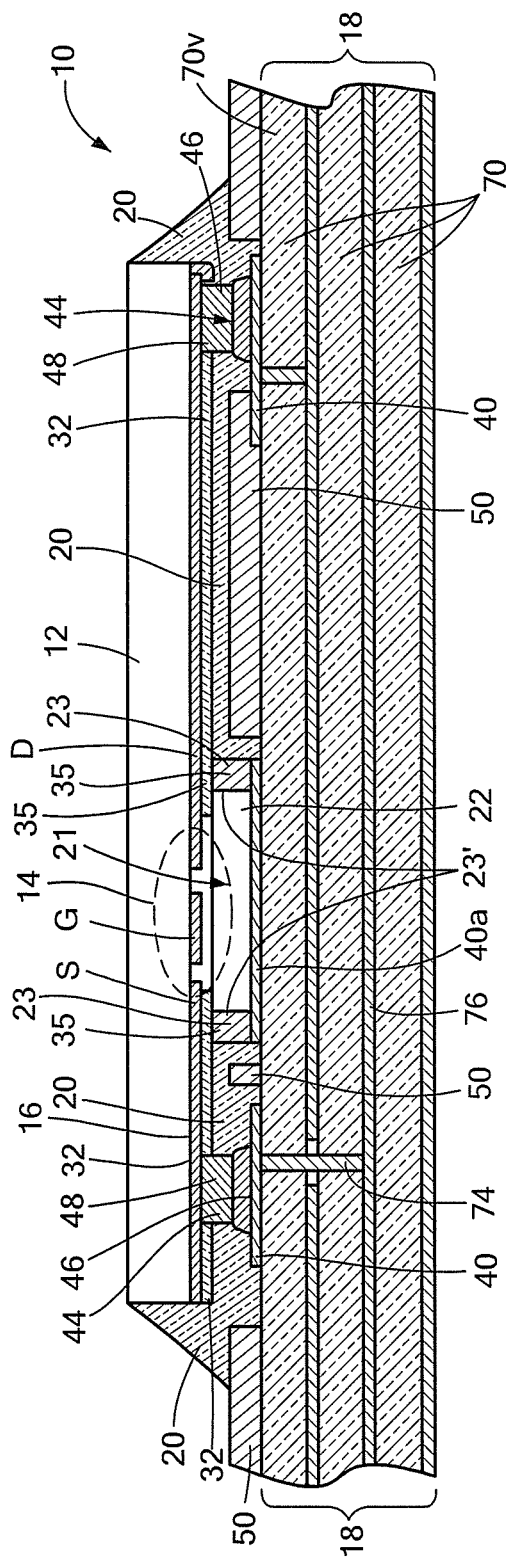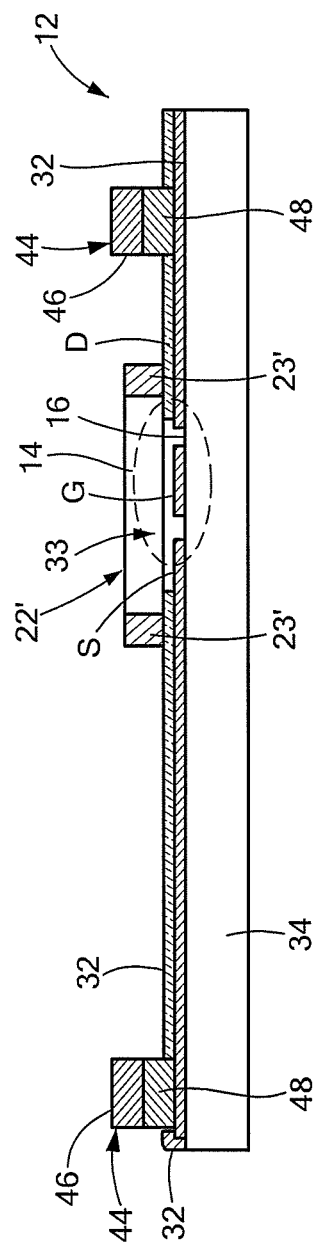
*FIG. 6*
*FIG. 7*

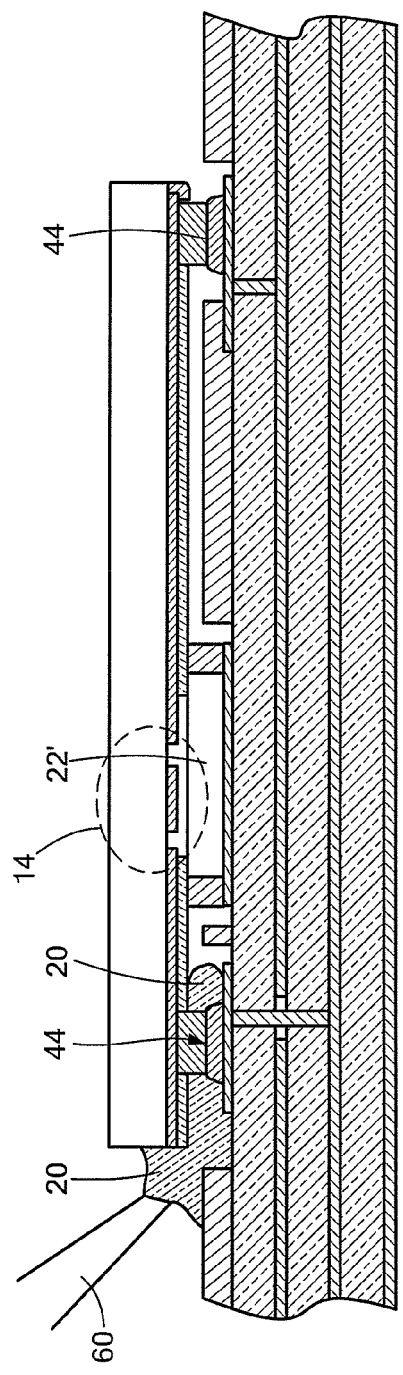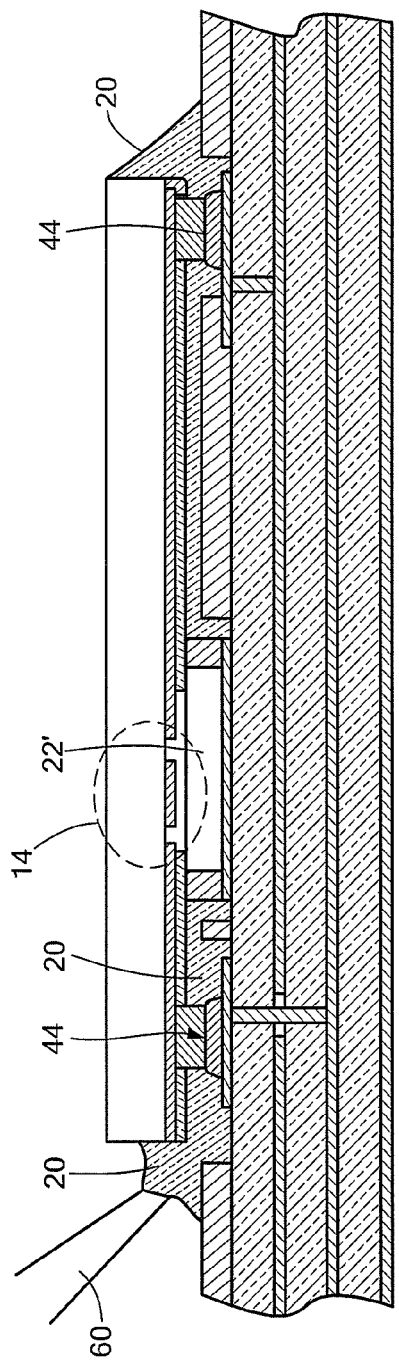

FLIP CHIP MOUNTED MONOLITHIC MICROWAVE INTEGRATED CIRCUIT (MMIC) STRUCTURE

TECHNICAL FIELD

This disclosure relates generally to flip chip mounted MMIC structures.

BACKGROUND

As is known in the art, Monolithic microwave integrated circuit ("MMIC") chips are often mounted on a printed circuit board (PCB) by metal or solder posts (sometimes referred to as bonding posts or bumps) to form a MMIC chip system. When a MMIC chip is mounted with the circuits facing the circuit board, it is referred to as a "MMIC flip chip system." The difference in thermal expansion properties between the MMIC flip chip and the circuit board can create mechanical stresses on the metal or solder posts when the system experiences temperature cycles or large thermal fluctuations. These stresses may render the system unreliable.

A conventional solution is to insert a dielectric underfill material (e.g., an adhesive) having desirable mechanical properties between the MMIC flip chip and the circuit board to reduce the stresses on the metal or solder posts. However, due to undesirable dielectric properties, underfill contacting sensitive components of the MMIC flip chip can degrade the electrical performance of the chip.

Prior solutions to this problem include using tall metal or solder posts that provide sufficient flexibility during thermal expansion to alleviate the need for underfill. Another approach is to apply underfill carefully to avoid the sensitive components of the MMIC flip chip. Both of these approaches require non-standard processes and are therefore unavailable or expensive to implement.

SUMMARY

In accordance with the present disclosure, a MMIC flip chip mounted to a circuit board is provided having an underfill material disposed between the MMIC and the circuit board and a barrier structure for preventing the underfill material from being disposed under an electronic device of the MMIC while providing a cavity under the electronic device.

In one embodiment, the barrier structure is disposed on the circuit board.

In one embodiment, the barrier structure is disposed on the MMIC.

In one embodiment, the barrier structure comprises one or more dam like structures.

In one embodiment, the barrier structure is a tub like structure.

In one embodiment, a structure is provided comprising: a MMIC having an electronic device; a circuit board having the MMIC flip chip mounted to the circuit board; an underfill material disposed between the MMIC and the circuit board; and a barrier structure for preventing the underfill material from being disposed under the active device while providing a cavity under the electronic device.

In one embodiment, the printed circuit board has an electronic device contact pad and wherein the electronic device contact pad is electrically connected to the electronic device.

In one embodiment, the underfill material is an adhesive.

In one embodiment, bonding posts are disposed between the printed circuit board and the MMIC and wherein the underfill material reduces mechanical stresses on the bonding posts.

In one embodiment, a structure is provided comprising: a MMIC having an electronic device; a circuit board having the MMIC flip chip mounted to the circuit board; an underfill material disposed between the MMIC and the circuit board; and a barrier structure for preventing the underfill material from being disposed under the electronic device while providing an gaseous filled region under the electronic device.

In one embodiment the printed circuit board has an active device contact pad and wherein the electronic device contact pad is electrically connected to the electronic device.

In one embodiment a structure is provided having: a MMIC having an electronic device disposed in a front surface of thereof; a printed circuit board; wherein the MMIC is flip-chip mounted to the printed circuit; an underfill material deposed between the printed circuit board and the front surface of the flip chip mounted MMIC; and a barrier structure for preventing the underfill material from being disposed under the device while providing an gaseous filled region within the barrier structure under the electronic device of the flip chip mounted MMIC.

In one embodiment, the structure includes bonding posts disposed between the printed circuit board and the MMIC and wherein the underfill material reduces mechanical stresses on the posts.

In one embodiment, the barrier structure creates a capillary between the flip chip mounted MMIC and the printed circuit board to direct the flow of underfill material away from the region under the electronic device.

In one embodiment, the barrier structure creates a capillary between the flip chip mounted MMIC and the printed circuit board to direct the flow of underfill away from the region under the electronic device and create a gas bubble in the region under the electronic device.

In one embodiment, the bonding posts comprise a metal and a solder on the metal wherein the metal post has a higher melting point that the solder and wherein when heated attaches the MMIC to the printed circuit board at a proper spacing there between to enable the barrier structure to prevent the underfill material from being disposed in a region under the electronic device.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIGS. 3A-3D are simplified cross-sectional views of the printed circuit board of FIG. 1 at various stages in the fabrication thereof in accordance with the disclosure;

FIGS. 4A-4E are simplified cross-sectional views showing the process of inserting an underfill material into the MMIC structure of FIG. 3D according to the disclosure, FIG. 4D being taken along line 4D-4D in FIG. 5B and FIG. 4E being taken along line 4E-4E in FIG. 5B;

FIG. 6 is a simplified, cross-sectional view of a portion of a MMIC structure having an MMIC chip flip chip bonded to a printed circuit board according to another embodiment of the disclosure;

FIG. 7 is a simplified, cross-sectional view of the portion of the MMIC chip of FIG. 1 prior to being flip chip mounted to the printed circuit board as shown in FIG. 6; and FIGS. 8A-8D are simplified cross-sectional views showing the process of bonding the MMIC structure of FIG. 6 to a printed circuit board according to the disclosure.

Like reference symbols in the various drawings indicate like elements.

DETAILED DESCRIPTION

Figure 1:
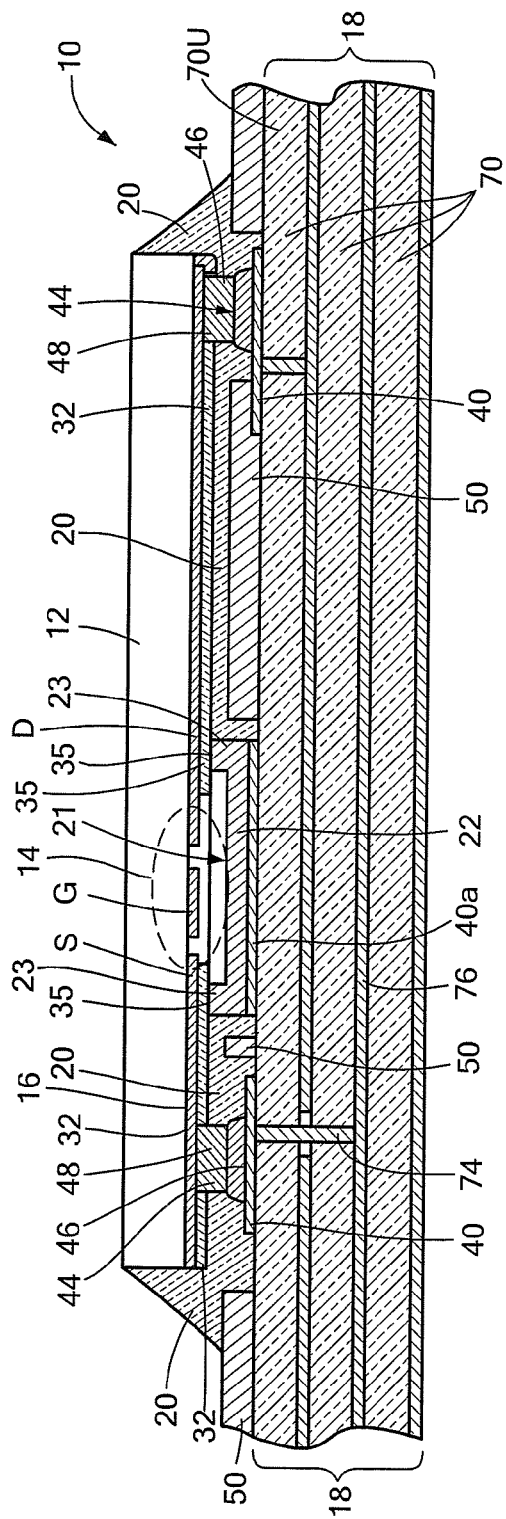
FIG. 1 is a simplified, cross-sectional view of a portion of a MMIC structure having an MMIC chip flip chip bonded to a printed circuit board according to the disclosure.

Referring now to FIG. 1, structure 10 is shown having: a Monolithic microwave integrated circuit (MMIC) chip 12. The chip 12 includes an electronic device 14, here for example a Field Effect Transistor (FET) having source (S), drain (D) and gate contacts (G) contacts, disposed in a front surface 16 of the chip 12. The MMIC chip 12 is shown in more detail in FIG. 2.

The structure 10 (FIG. 1) includes a multi-layer printed circuit board 18. The MMIC chip 12 is flip-chip mounted to the printed circuit 18, as shown. The structure 10 includes an underfill material 20 deposed between the printed circuit board 18 and the front surface 16 of the flip chip mounted MMIC 12. The structure 10 includes a barrier structure 22 for preventing the underfill material 20 from being disposed under the electronic device 14 while providing a gas, for example air, filled region 24 within the barrier structure 22 under the electronic device 14 of the flip chip mounted MMIC chip 12. The underfill material; 20 is an adhesive, here for example, a commercially available underfill product such as Hysol EC1172A Ellsworth Adhesives, W129 N10825 Washington Dr., Germantown, Wis. 53022. Here the barrier structure 22 is a tub like structure having a cavity 21 therein formed by sidewalls 23 disposed about the outer periphery of the electronic device 14.

More particularly, a dielectric layer 32, here for example, Benzocyclobutene (BCB), is photolithographically formed over the front surface 16 of the MMIC chip 12 and patterned to have an opening therein 33 over the electronic device 14. It is noted that the upper surface 35 of the sidewalls 23 are in contact with the BCB 32 to prevent the underfill material 20 from passing into the cavity 21 of the barrier structure 22. It is further noted that the contact between the barrier structure 22 and the BCB 32 does not have to form a perfect seal in order to prevent the underfill material 20 from passing into the cavity 21 of the barrier structure 22, due to capillary between the flip chip mounted MMIC and the printed circuit board and gas pressure effects created by the overall structure 10 to be described below in connection with FIGS. 4C-4D.

The printed circuit board 18 (FIG. 1) has electronic device contact pads 40 electrically connected to the electronic device 14. More particularly, the MMIC chip 12 has electrically conductive bonding posts 44 disposed on the contact pads 40. The bonding posts 44 have an lower layer 48 of a metal, such as for example, copper, having a height of here for example, 50 microns and an upper layer 46 of solder, here, for example, having a height of 85 microns, on top of the metal layer 48. More particularly, the metal layer 48 metal has a melting temperature higher than the melting temperature of the solder 46. The printed circuit board 18 has a solder mask 50 (FIG. 1), here for example, made of a photo imagable polymer, such as, for example, a commercially available solder mask product such as PSR-4000 LDI, Taiyo America, Inc. 2675 Antler Dr., Carson City, Nev. 89701, having a height of 25 microns, photolithographically formed on selected regions of the upper surface thereof. The solder 46, when heated, attaches the MMIC chip 12 to the printed circuit board 18 and provides proper spacing there between to enable the barrier structure 22 to prevent the underfill material 20 from being disposed in the region 24 under the electronic device 14 while the solder mask 50 prevents melted solder from flowing laterally beyond the mask 50. The underfill material 20, in addition to providing an adhesive to bond the MMIC chip 12 to the printed circuit board 18, reduces mechanical stresses on the posts 44.

It should be understood that some of the contact pads may not be directly connected to the electronic device. For example, they may be connected to matching networks, etc., (not shown) between the pads and the electronic devices.

As will be described in more detail below, the barrier structure 22 creates a capillary in the gap between the flip chip mounted MMIC chip 12 and the printed circuit board 18 to direct the flow of underfill material 20 away from the region 24 under the electronic device 14 and create a gas, for example air or nitrogen, bubble in the region 24 under the electronic device 12.

Figure 2:
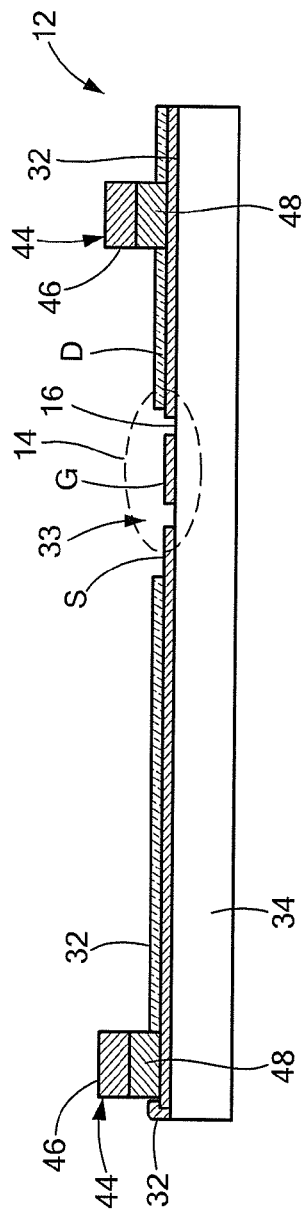
FIG. 2 is a simplified, cross-sectional view of the portion of the MMIC chip of FIG. 1 prior to being flip chip mounted to the printed circuit board as shown in FIG. 1.
Figure 2A:
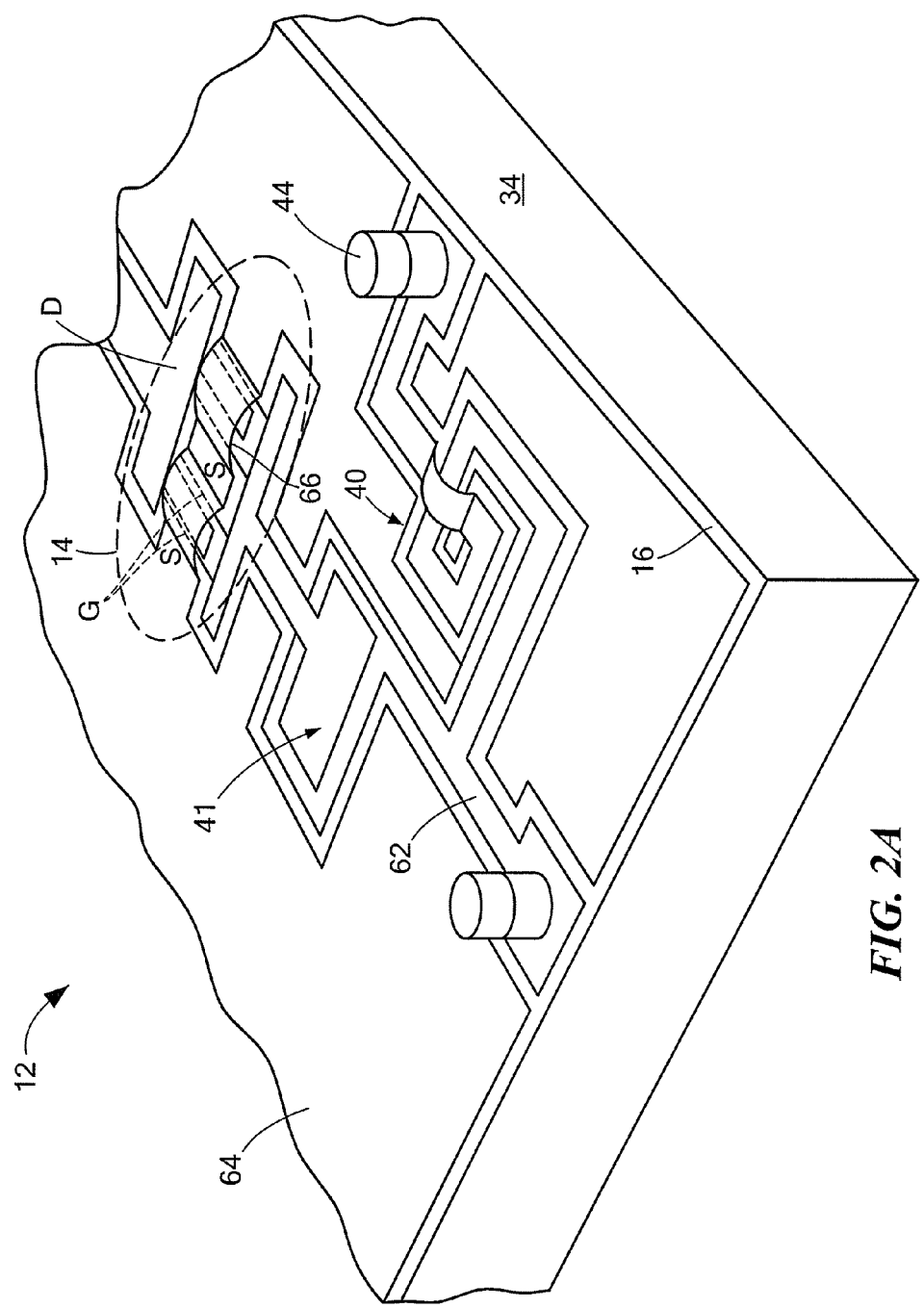
FIG. 2A is a simplified, isometric view of the portion of the MMIC chip of FIG. 1 prior to being flip chip mounted to the printed circuit board as shown in FIG. 1.

Referring now to FIG. 2A, the Monolithic Microwave Integrated Circuit (MMIC) 12 is shown in more detail to include a substrate 34 having typically a plurality of electronic devices i.e., passive and active semiconductor devices, (here only one active device 14 being shown in FIG. 2). The MMIC 12 includes electrical strip conductors 62, connecting the active device 14, also disposed on the front surface 16 of the substrate 34. The MMIC 12 also includes a ground plane conductor 64 on the front surface 16 of the substrate 60, the strip conductors 62 and the ground plane conductor 64 (FIG. 2A) providing coplanar waveguide (CPW) transmission lines electrically interconnected to the active device 14.

The MMIC 12 (FIG. 2A) also includes, as noted above, active device source, drain and gate contacts S, D and G, respectively, disposed on the front surface 16 of a substrate 34. The active device contacts S, D and G are in electrical contact with the active device 14. The front surface of the MMIC 12 includes the BCB layer 32 (not shown in FIG. 2A but shown in FIG. 2) described above, and the posts 44, described above. The MMIC 12 includes a passive devices, such as a DC blocking capacitor 40 and RF blocking inductor (i.e., RF choke) 41 (FIG. 2A); it being understood that additional passive electronic devices such as capacitors and inductors, not shown may be in the MMIC).

Here, the active device 14 is a FET having: a plurality of finger-like gate electrodes G connected to a gate contacts G, a plurality of source electrodes S electrically interconnected together by an air-bridge conductor 66, and drain electrodes D disposed under the air bridge conductor 66 connected to the CPW transmission lines.

As noted above, the microwave structure 10 includes a multilayer printed circuit board 18 (FIG. 1) comprising a plurality of stacked dielectric layers 70, an upper one of the dielectric layers 70U having an electrically conductive pads 40 thereon; a conductive via 74 passing from the /pad 40 on the upper one of the dielectric layers 70U, through the upper one of the dielectric layers 70U to an electrical conductor 76 on the surface of another, lower one of the dielectric layers 70L in any conventional arrangement.

Figure 3A:
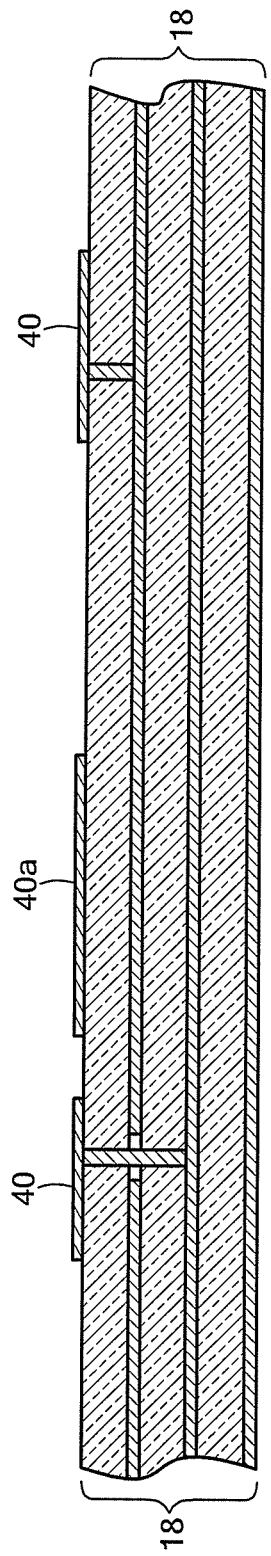
Figure 3B:
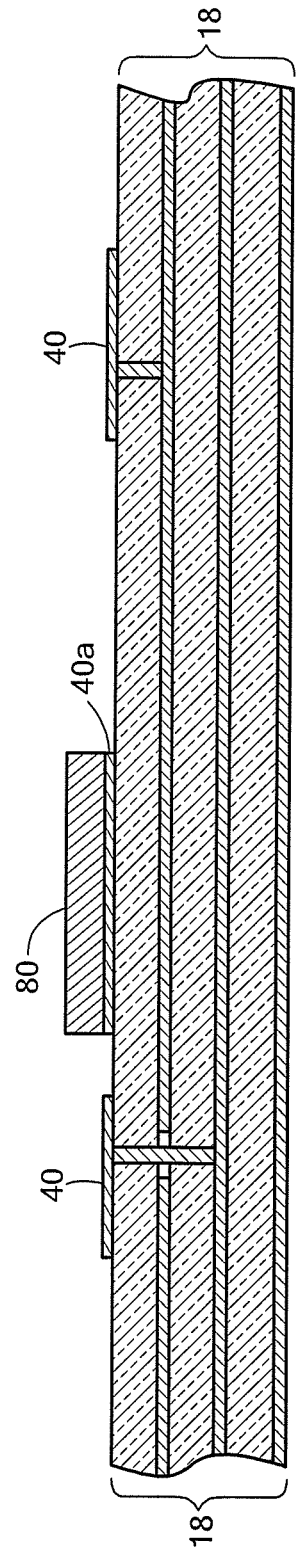

Referring now to FIGS. 3A-3D, the multi-level printed circuit board 18 is provided as shown in FIG. 3A. It is noted that in addition to the pads 40, an additional conductive pad 40a (also shown in FIG. 1) is formed when the contact pads 40 are formed. The additional contact pad 40a is formed on the region of the printed circuit board 18 which is be under the active device 14, when assembled as shown in FIG. 1. Next, referring to FIG. 3B, a metal layer 80 of, for example copper is deposited over the upper surface of the printed circuit board 18 and patterned using conventional lithography on the additional conductive pad 40a, as shown in FIG. 3B. Next, the cavity 21 (a recess to form the tub like structure 22) is formed on the upper surface of the layer 80 here using laser ablation to form the barrier structure 22 having the sidewalls 23, here, for example 50 microns in height, so that the barrier 22 surrounds the outer periphery of the active device 14, as shown in FIG. 5B. Next, the solder mask 50 (FIG. 3D) is formed to produce the structure shown in FIG. 3D.

Next, referring to FIG. 4A, the MMIC 12 and the printed circuit board 18 are aligned as shown in FIG. 4A. More particularly, the posts 44 are disposed on the contact pads 40, as shown. It is noted that the barrier structure 22 is disposed under, but spaced from, the active device 14. Next, referring to FIG. 4B, the assembly is heated in, for example a standard reflow process line so that posts 44 are heated and the solder 46 melts or reflows with downward pressure on the MMIC 12 so that the upper surface 35 of the sidewalls 23 of the barrier structure 22 contact the BCB layer 32, as shown in FIG. 4B.

More particularly, the metal 48 of the post 44 has a higher melting point that the solder 46 of the post 44 so that when heated the post 44 attaches the MMIC 12 to the printed circuit board 18 at a proper spacing there between to enable the barrier structure 22 to prevent the underfill material 20, to be added, from flowing into the region 24 under the active device 14 (more particularly into the cavity 21 in the barrier structure 22.

Figure 4C:
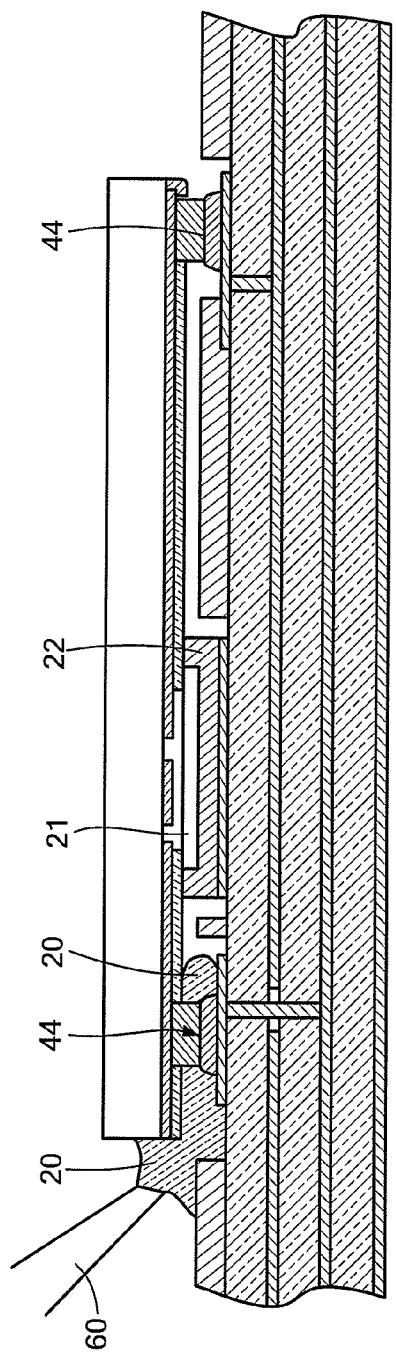
Figure 4D:
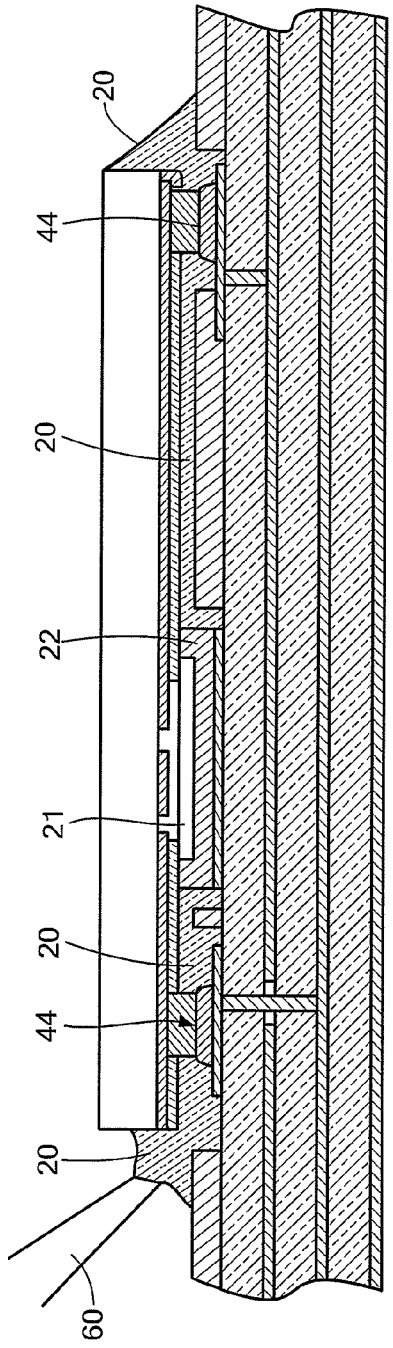
Figure 4E:
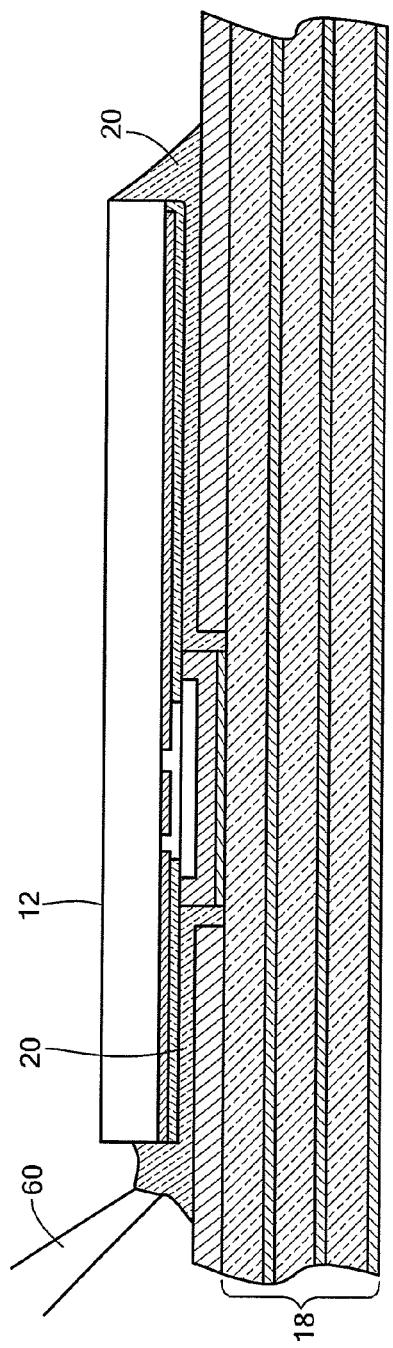
Figure 5A:
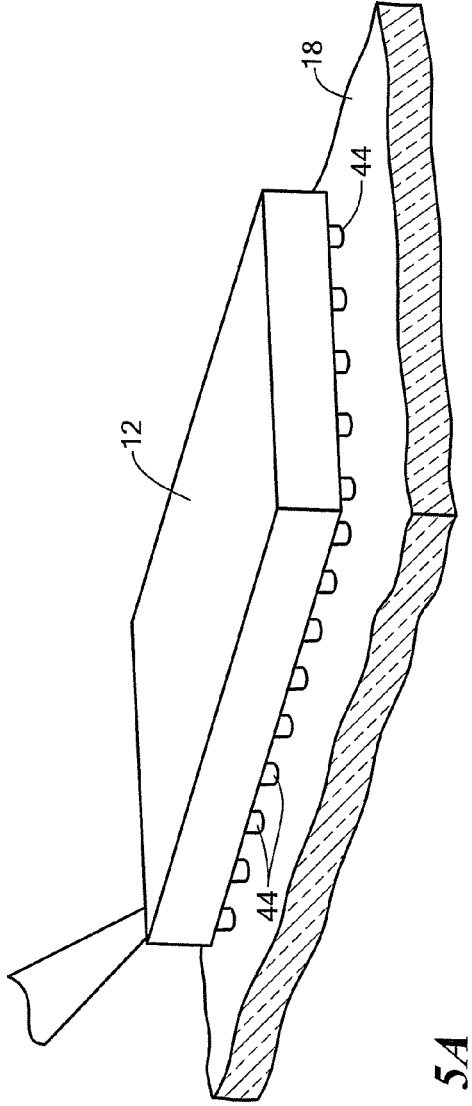
FIGS. 5A and 5B are isometric and top views, respectively, of the structure of FIG. 1.
Figure 5B:
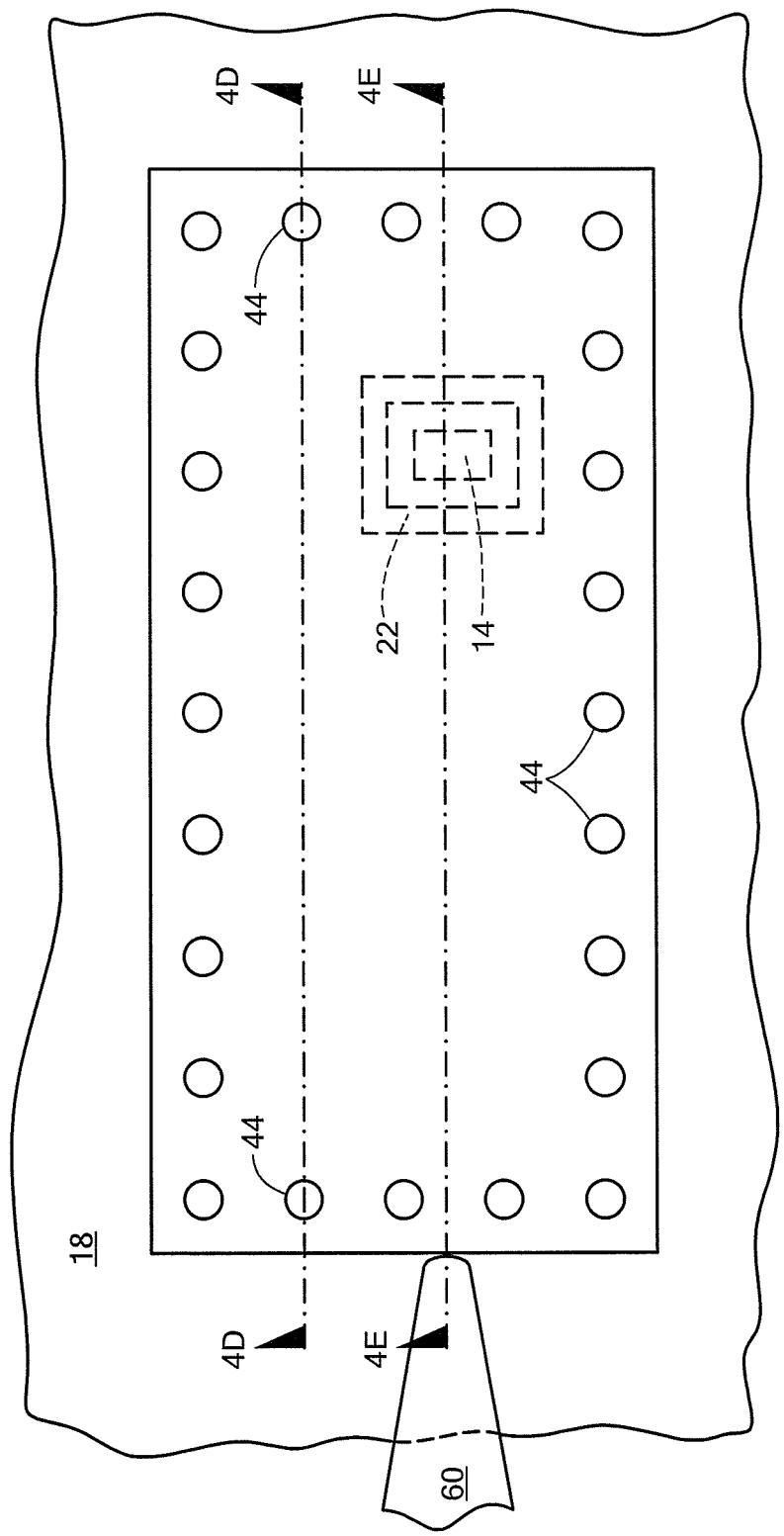
Figure 8A:
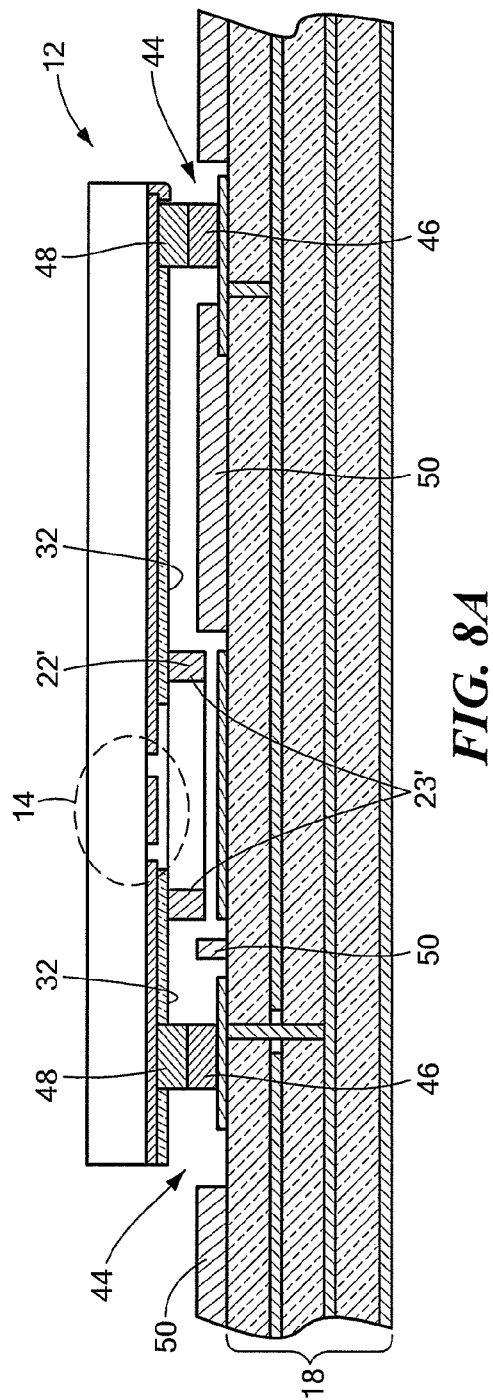
Figure 8B:
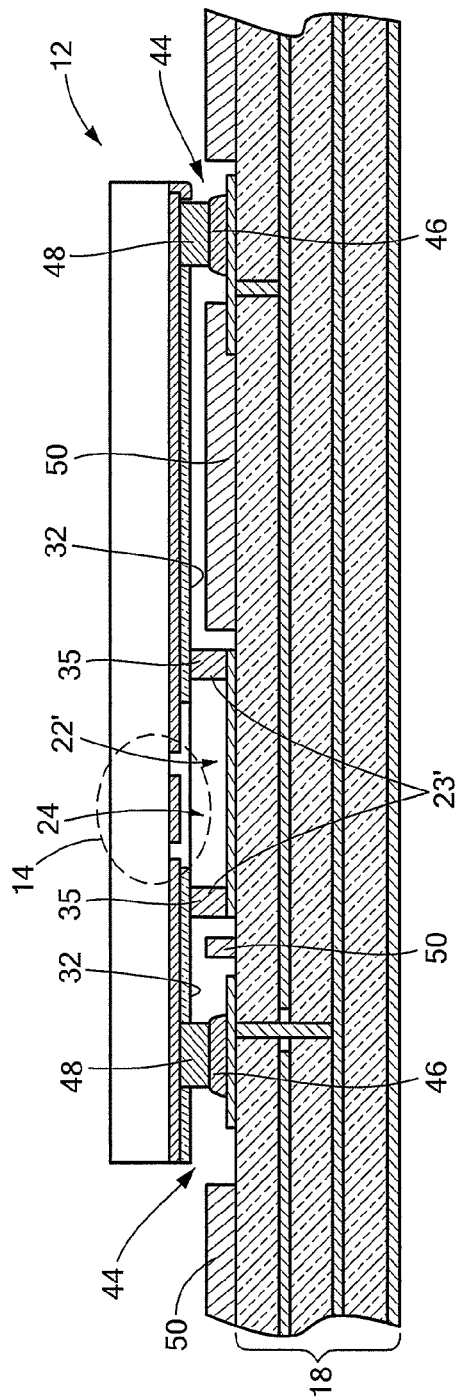

Next, after the MMIC chip 12 is bonded to the printed circuit board 18, as shown in FIGS. 1 and 5, to provide the structure 10 prior to adding the underfill material 20, the underfill material 20 is dispensed in the gap between the MMIC chip 12 and the printed circuit board 18 between the posts 44 using a needle-like dispenser 60 on or near the chip 12 (FIGS. 4C and 5B) and the underfill material 20 flows laterally via capillary action in the gap between the surface of the flip chip mounted MMIC chip 12 and the surface of the printed circuit board 18 as shown in FIG. 4C. It is noted that the barrier structure 22 creates a capillary formed by the gap between the flip chip mounted MMIC and the printed circuit board to direct the flow of underfill material 20 away from the region under the active device 14 and also creates a gas bubble in the cavity 21 of the tub-like barrier structure 22; i.e., in the region 24 under the active device 14. The process is illustrated in FIGS. 4C and 4D. The resulting structure 10 is shown in FIG. 1.

A number of embodiments of the disclosure have been described. Nevertheless, it will be understood that various modifications may be made without departing from the spirit and scope of the disclosure. For example, while in the description above, the barrier structure 22 is disposed on the circuit board 12, the barrier structure 22' having sidewalls 23' may be disposed about the MMIC 12 as shown in FIGS. 6 and 7, the process of the process of bonding the MMIC structure of FIG. 6 to a printed circuit board according to the disclosure being shown in FIGS. 8A-8D. More particularly, the barrier 22' is here a dielectric, for example BCB, and is formed photolithographically on the upper surface of the MMIC chip (FIG. 9). Further, the barrier structure 22 may comprises one or more dam like structures, such as a vertically extending wall around the electronic device 12 rather than the tub like structure 22 described above. Further, while the cavity in the barrier structure 22 has been described over an active electronic device, the cavity may be over passive electronic devices such an inductor and/or capacitor. Accordingly, other embodiments are within the scope of the following claims.

What is claimed is:

1. A structure comprising: a MMIC flip chip mounted to a circuit board having an underfill material disposed between the MMIC flip chip and the circuit board and a barrier structure, the barrier structure having walls to prevent the underfill material from being disposed under an electronic device of the MMIC flip chip and for providing a cavity under the electronic device, and wherein the walls provide sidewalls of the cavity.

2. The structure recited in claim 1 wherein the barrier structure is disposed on the circuit board.

3. The structure recited in claim 1 wherein the barrier structure is disposed on the MMIC.

4. The structure recited in claim 2 wherein the barrier structure comprises at least one dam like structure.

5. The structure recited in claim 3 wherein the barrier structure comprises at least one dam like.

6. The structure recited in claim 2 wherein the barrier structure is a tub like structure.

7. A structure comprising: a MMIC having an electronic device; a circuit board having the MMIC flip chip mounted to the circuit board; an underfill material disposed between the MMIC and the circuit board; and a barrier structure having sidewalls for preventing the underfill material from being disposed in a region under the electronic device while providing a cavity under the electronic device.

8. The structure recited in claim 7 wherein the underfill material is a flowable material adhesive and wherein the walls prevent the underfill material from flowing under the electronic device.

9. The structure recited in claim 7 includes bonding posts disposed between the printed circuit board and the MMIC and wherein the underfill material reduces mechanical stresses on the posts.

10. A structure comprising: a MMIC having an electronic device; a circuit board having the MMIC flip chip mounted to the circuit board; an underfill material disposed between the MMIC and the circuit board; and a barrier structure having sidewalls for preventing the underfill material from being disposed under the electronic device while providing a gas filled region under the electronic device.

11. The structure recited in claim 10 wherein the printed circuit board has an electronic device contact pad and wherein the electronic device contact pad is electrically connected to the electronic device.

12. The structure recited in claim 10 wherein the underfill material is an adhesive.

13. The structure recited in claim 10 including bonding posts disposed between the printed circuit board and the MMIC and wherein the underfill material reduces mechanical stresses on the posts.

14. A structure, comprising:
(A) a MMIC having an electronic device disposed in a front surface of thereof;
(B) a printed circuit board; and
(C) wherein the MMIC is flip-chip mounted to the printed circuit;
(D) an underfill material deposed between the printed circuit board and the front surface of the flip chip mounted MMIC; and
(E) a barrier structure having sidewalls wherein the sidewalls prevent the underfill material from being disposed under the electronic device while providing a gas filled region within the barrier structure under the electronic device of the flip chip mounted MMIC.

15. The structure recited in claim 14 wherein the underfill material is an adhesive.

16. The structure recited in claim 14 including bonding posts disposed between the printed circuit board and the MMIC and wherein the underfill material reduces mechanical stresses on the posts.

17. The structure recited in claim 7 wherein the barrier structure creates a capillary to direct the flow of underfill material away from the region under the electronic device.

18. The structure recited in claim 7 wherein the barrier structure creates a capillary to direct the flow of underfill away from the region under the electronic device and create a gas bubble in the region under the electronic device.

19. The structure recited in claim 10 wherein the bonding posts comprising a metal and a solder on the metal wherein the metal has a melting temperature above the melting temperature of the solder and wherein solder when heated attaches the MMIC to the printed circuit board and proper spacing therebetween to enable the barrier structure barrier structure to prevent the underfill material from being disposed in a region under the electronic device.

20. The structure recited in claim 1 wherein the electronic device is an active electronic device.

21. A structure comprising:
a circuit board;
a flip chip circuit mounted to the circuit board;
an underfill material disposed between the flip chip circuit and the circuit board;
a barrier structure, having walls disposed along a direction transverse to the circuit board,
wherein the underfill material abuts the walls; and
wherein the walls provide sidewall portions of a cavity disposed under an electronic device of the flip chip circuit.

22. The structure recited in claim 21 wherein the barrier structure is a tub like structure.

23. The structure recited in claim 21 wherein outer portions of the walls abut the underfill material and inner portions of the walls provide the sidewall portions of the cavity.

24. The structure recited in claim 14 wherein the sidewalls are disposed in a direction transverse to the printed circuit board and to the front surface.

25. The structure recited in claim 21 wherein the underfill material is an adhesive.

* * * * *